(12) United States Patent
Manfrini et al.

(10) Patent No.: US 12,120,885 B2
(45) Date of Patent: Oct. 15, 2024

(54) FERROELECTRIC TUNNEL JUNCTION MEMORY DEVICE USING A MAGNESIUM OXIDE TUNNELING DIELECTRIC AND METHODS FOR FORMING THE SAME

(71) Applicant: Taiwan Semiconductor Manufacturing Company Limited, Hsinchu (TW)

(72) Inventors: Mauricio Manfrini, Hsinchu (TW); Bo-Feng Young, Taipei (TW); Chun-Chieh Li, Taipei (TW); Han-Jong Chia, Hsinchu (TW); Sai-Hooi Yeong, Hsinchu (TW)

(73) Assignee: Taiwan Semiconductor Manufacturing Company Limited, Hsinchu (TW)

(*) Notice: Subject to any disclaimer, the term of this patent is extended or adjusted under 35 U.S.C. 154(b) by 0 days.

(21) Appl. No.: 18/354,858

(22) Filed: Jul. 19, 2023

(65) Prior Publication Data
US 2024/0023341 A1 Jan. 18, 2024

Related U.S. Application Data

(62) Division of application No. 17/229,926, filed on Apr. 14, 2021, now Pat. No. 11,805,657.

(51) Int. Cl.
*H01L 29/78* (2006.01)
*H01L 21/28* (2006.01)
(Continued)

(52) U.S. Cl.
CPC ........ *H10B 51/30* (2023.02); *H01L 29/40111* (2019.08); *H01L 29/516* (2013.01); *H01L 29/6684* (2013.01); *H01L 29/78391* (2014.09)

(58) Field of Classification Search
CPC ........... H01L 27/1159; H01L 29/40111; H01L 29/516; H01L 29/6684; H01L 29/78391;
(Continued)

(56) References Cited

U.S. PATENT DOCUMENTS 11,521,666 B1 * 12/2022 Dokania ............... G11C 11/221
11,532,635 B1 * 12/2022 Dokania ............... H10B 53/10
(Continued)

FOREIGN PATENT DOCUMENTS

KR 20200002754 A 1/2020
TW 202013681 A 4/2020

OTHER PUBLICATIONS

Korean Patent and Trademark Office, Application No. 10-2021-0073712, Office Action mailed Apr. 24, 2023, 10 pages.
(Continued)

*Primary Examiner* — Sheikh Maruf
(74) *Attorney, Agent, or Firm* — The Marbury Law Group, PLLC

(57) ABSTRACT

A ferroelectric tunnel junction (FTJ) memory device includes a bottom electrode located over a substrate, a top electrode overlying the bottom electrode, and a ferroelectric tunnel junction memory element located between the bottom electrode and the top electrode. The ferroelectric tunnel junction memory element includes at least one ferroelectric material layer and at least one tunneling dielectric layer.

20 Claims, 11 Drawing Sheets

(51) Int. Cl.
  *H01L 29/51* (2006.01)
  *H01L 29/66* (2006.01)
  *H10B 51/30* (2023.01)

(58) Field of Classification Search
  CPC .............. H01L 28/56; H01L 27/11507; H01L 27/11509
  USPC .......................................................... 257/401
  See application file for complete search history.

(56) References Cited

U.S. PATENT DOCUMENTS

| | | |
|---|---|---|
| 11,837,268 B1* | 12/2023 | Dokania .............. H01L 25/0652 |
| 2016/0148974 A1* | 5/2016 | Lee ........................ H10N 50/01 |
| | | 257/421 |
| 2018/0182956 A1 | 6/2018 | Ha et al. |
| 2018/0226571 A1 | 8/2018 | Umebayashi et al. |
| 2019/0088664 A1 | 3/2019 | Kabuyanagi et al. |
| 2019/0115353 A1 | 4/2019 | O'Brien et al. |
| 2020/0035560 A1* | 1/2020 | Block ................ H01L 27/0688 |
| 2020/0136027 A1* | 4/2020 | Wu ........................ H10N 50/01 |
| 2020/0273867 A1* | 8/2020 | Manipatruni ........ G11C 11/2257 |
| 2021/0013229 A1* | 1/2021 | Sakuma .................. H10B 41/20 |
| 2021/0111179 A1* | 4/2021 | Shivaraman ........ G11C 11/2275 |
| 2021/0408223 A1* | 12/2021 | Chia ........................ H01L 28/56 |
| 2022/0028994 A1* | 1/2022 | Chen ................. H01L 21/76829 |
| 2023/0200082 A1* | 6/2023 | Gomes .................... H01L 28/90 |
| | | 257/295 |
| 2023/0253367 A1* | 8/2023 | Gao .................... H01L 23/3128 |
| | | 257/774 |

OTHER PUBLICATIONS

Taiwan Patent and Trademark Office, Application No. 110121586 Office Action, mailed Nov. 16, 2021, 7 pages.

German Patent and Trademark Office, Application No. 10 2021 111 163.3, First Examination Report mailed Oct. 19, 2022, 6 pages.

Parkin S.S.P. et al. "Giant Tunnelling Magnetoresistance at Room Temperature With MgO (100) Tunnel Barriers" Nature Materials, vol. 3, pp. 862-867, Dec. 2004.

* cited by examiner

FERROELECTRIC TUNNEL JUNCTION MEMORY DEVICE USING A MAGNESIUM OXIDE TUNNELING DIELECTRIC AND METHODS FOR FORMING THE SAME

RELATED APPLICATIONS

This application is a divisional application of U.S. application Ser. No. 17/229,926 entitled "Ferroelectric Tunnel Junction Memory Device Using a Magnesium Oxide Tunneling Dielectric and Methods for Forming the Same," filed on Apr. 14, 2022, which claims the benefit of priority from U.S. Provisional Application No. 63/042,595 entitled "Semiconductor Device and Manufacturing Method Thereof," filed on Jun. 23, 2020, the entire contents of both of which are hereby incorporated by reference for all purposes.

BACKGROUND

A ferroelectric material is a material that may have spontaneous nonzero electrical polarization (i.e., non-zero total electrical dipole moment) when the external electrical field is zero. The spontaneous electrical polarization may be reversed by a strong external electric field applied in the opposite direction. The electrical polarization is dependent not only on the external electrical field at the time of measurement, but also on the history of the external electrical field, and thus, has a hysteresis loop. The maximum of the electrical polarization is referred to as saturation polarization. The electrical polarization that remains after an external electrical field that induces saturation polarization is no longer applied (i.e., turned off) is referred to as remnant polarization. The magnitude of the electrical field that needs to be applied in the opposite direction of the remnant polarization in order to achieve zero polarization is referred to as coercive electrical field. For the purposes of forming memory devices, it is generally desirable to have high remnant polarization and high coercive electrical field. High remnant polarization may increase the magnitude of an electrical signal. A high coercive electrical field makes the memory devices more stable against perturbations caused by noise-level electrical field and interferences.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
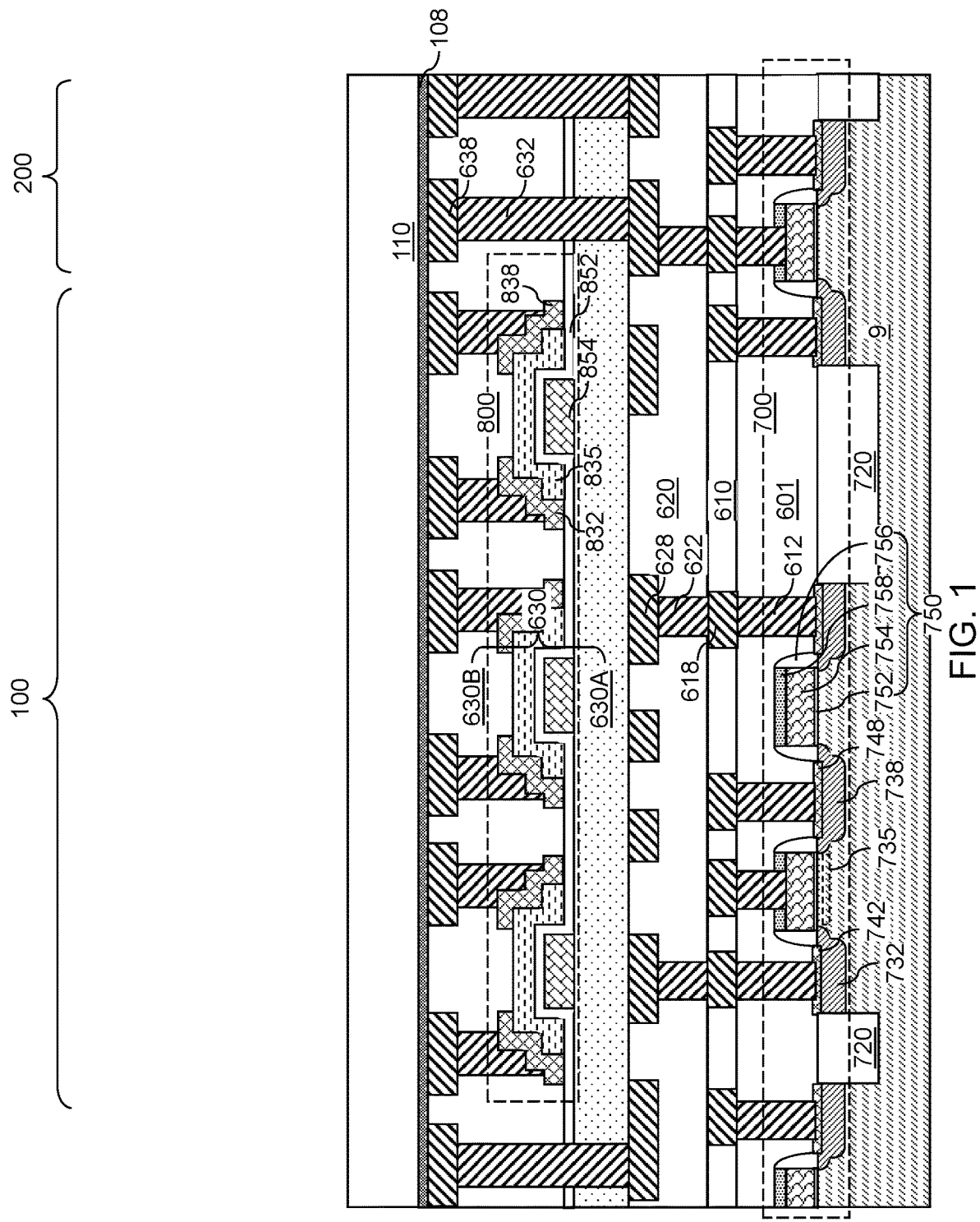
FIG. 1 is a vertical cross-sectional view of an exemplary structure after formation of complementary metal-oxide-semiconductor (CMOS) transistors, metal interconnect structures formed in dielectric material layers, and thin film transistors (TFTs) according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the structures and methods of the present disclosure may be used to form a ferroelectric tunnel junction memory cell and/or an array of ferroelectric tunnel junction memory cells. Ferroelectric tunnel junction memory cells are promising candidates for back-end-of-line (BEOL) memories due to their ultra-low power consumption as compared to other emerging non-volatile technologies such as magnetoresistive random-access memory (MRAM) and resistive random access memory (RRAM). By adding a tunneling insulating layer (TIL) adjacent to a metal-ferroelectric-metal capacitor, a Metal-FE-Insulator-Metal (MFIM) tunneling device may be formed. The structures and methods of the present disclosure may be used to form a ferroelectric tunnel junction memory cell including magnesium oxide as a tunneling dielectric material. Magnesium oxide may allow for a more coherent electron tunneling and therefore, a large tunneling electroresistance (TER). The various aspects of the present disclosure are now described in detail with reference to accompanying drawings.

FIG. 1 is a vertical cross-sectional view of an exemplary structure after formation of complementary metal-oxide-semiconductor (CMOS) transistors, metal interconnect structures formed in dielectric material layers, and thin film transistors (TFTs) according to an embodiment of the present disclosure. Referring to FIG. 1, an exemplary structure according to an embodiment of the present disclosure is illustrated. The exemplary structure includes a substrate 9, which may be a semiconductor substrate such as a commercially available silicon substrate. Shallow trench isolation structures 720 including a dielectric material such as silicon oxide may be formed in an upper portion of the substrate 9. Suitable doped semiconductor wells, such as p-type wells and n-type wells, may be formed within each area that is laterally enclosed by a portion of the shallow trench isolation structures 720. Field effect transistors may be formed over the top surface of the substrate 9. For example, each field effect transistor may include a source region 732, a drain region 738, a semiconductor channel 735 that includes a surface portion of the substrate 9 extending between the source region 732 and the drain region 738, and a gate structure 750. The semiconductor channel 735 may include a single crystalline semiconductor material. Each gate structure 750 may include a gate dielectric 752, a gate electrode 754, a gate cap dielectric 758, and a dielectric gate spacer 756. A source-side metal-semiconductor alloy region 742 may be formed on each source region 732, and a drain-side metal-semiconductor alloy region 748 may be formed on each drain region 738.

The exemplary structure may include a memory array region 100 in which an array of memory elements may be subsequently formed, and a peripheral region 200 in which logic devices that support operation of the array of memory elements may be formed. In one embodiment, devices (such as field effect transistors) in the memory array region 100 may include bottom electrode access transistors that provide access to bottom electrodes of memory cells to be subsequently formed. Top electrode access transistors that provide access to top electrodes of memory cells to be subsequently formed may be formed in the peripheral region 200 at this processing step. Generally, access transistors may be formed over the substrate 9 such that a source region 732 or a drain region 738 of each access transistor is electrically connected to a bottom electrode or to a top electrode of a respective memory cell by a respective set of metal interconnect structure.

Devices (such as field effect transistors) in the peripheral region 200 may provide functions that are needed to operate the array of memory cells to be subsequently formed. Specifically, devices in the peripheral region may be configured to control the programming operation, the erase operation, and the sensing (read) operation of the array of memory cells. For example, the devices in the peripheral region may include a sensing circuitry and/or a top electrode bias circuitry. The devices formed on the top surface of the substrate 9 may include complementary metal-oxide-semiconductor (CMOS) transistors and optionally additional semiconductor devices (such as resistors, diodes, capacitors, etc.), and are collectively referred to as CMOS circuitry 700. These devices may be typically formed in a front-end-of-line (FEOL).

Various metal interconnect structures formed within dielectric material layers may be subsequently formed over the substrate 9 and the semiconductor devices thereupon (such as field effect transistors). The dielectric material layers may include, for example, a contact-level dielectric material layer 601, a first metal-line-level dielectric material layer 610, a second line-and-via-level dielectric material layer 620, and a third line-and-via-level dielectric material layer 630. The metal interconnect structures may include device contact via structures 612 formed in the contact-level dielectric material layer 601 and contact a respective component of the CMOS circuitry 700, first metal line structures 618 formed in the first metal-line-level dielectric material layer 610, first metal via structures 622 formed in a lower portion of the second line-and-via-level dielectric material layer 620, second metal line structures 628 formed in an upper portion of the second line-and-via-level dielectric material layer 620, second metal via structures 632 formed in a lower portion of the third line-and-via-level dielectric material layer 630, and third metal line structures 638 formed in an upper portion of the third line-and-via-level dielectric material layer 630. In one embodiment, the second metal line structures 628 may include source lines that are connected to a source-side power supply for an array of memory elements. The voltage provided by the source lines may be applied to the bottom electrodes through the access transistors provided in the memory array region 100.

Each of the dielectric material layers (601, 610, 620, 630) may include a dielectric material such as undoped silicate glass, a doped silicate glass, organosilicate glass, amorphous fluorinated carbon, porous variants thereof, or combinations thereof. Other dielectric materials are within the contemplated scope of disclosure. Each of the metal interconnect structures (612, 618, 622, 628, 632, 638) may include at least one conductive material, which may be a combination of a metallic liner layer (such as a metallic nitride or a metallic carbide) and a metallic fill material. Each metallic liner layer may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic materials within the contemplated scope of disclosure may also be used. In one embodiment, the first metal via structures 622 and the second metal line structures 628 may be formed as integrated line and via structures by a dual damascene process, and/or the second metal via structures 632 and the third metal line structures 638 may be formed as integrated line and via structures. While the present disclosure is described using an embodiment in which an array of memory cells is formed over the third line-and-via-level dielectric material layer 630, embodiments are expressly contemplated herein in which the array of memory cells may be formed at a different metal interconnect level.

In one embodiment, a transistor, like thin film transistors (TFTs) 800 may be formed in one of the metal interconnect levels. For example, the TFTs 800 may be formed within the second line-and-via-level dielectric material layer 620 or within the third line-and-via-level dielectric material layer 630. In an illustrative example, the TFTs 800 may be formed within the third line-and-via-level dielectric material layer 630. In this embodiment, the third line-and-via-level dielectric material layer 630 may include a lower dielectric material layer 630A that may be formed over the second line-and-via-level dielectric material layer prior to formation of the TFTs, and an upper dielectric material layer 630B that may be formed over the TFTs. Each TFT may include a respective TFT gate electrode 854, a respective TFT gate dielectric that may be a portion of a continuous TFT gate dielectric layer 852 that overlies the TFT gate electrode 854, a respective TFT channel 835 that overlies the respective TFT gate electrode 854, a respective TFT source region 832 that contacts a top surface of a first end of the respective TFT channel 835, and a respective TFT drain region 838 that contacts a top surface of a second end of the respective TFT channel 835. A subset of the second metal via structures 632 may contact a respective one of the TFT gate electrodes 854, the TFT source regions 832, and the TFT drain regions 838. The TFT transistors 800 may function as access transistors that controls access to the bottom electrodes or top electrodes of memory cells to be subsequently formed above. While the present disclosure is described employing a specific configuration for the TFT gate electrodes 854, the TFT source regions 832, and the TFT drain regions 838, alternative configurations for the TFT gate electrodes 854, the TFT source regions 832, and the TFT drain regions 838 may also be employed. For example, each of the TFT gate electrodes 854, the TFT source regions 832, and the TFT drain regions 838 may be raised, recessed, or laterally shifted relative to adjacent elements.

A dielectric cap layer 108 and a connection-via-level dielectric layer 110 may be sequentially formed over the metal interconnect structures and the dielectric material layers. For example, the dielectric cap layer 108 may be formed on the top surfaces of the third metal line structures 638 and on the top surface of the third line-and-via-level dielectric material layer 630. The dielectric cap layer 108 includes a dielectric capping material that may protect underlying metal interconnect structures such as the third metal line structures 638. In one embodiment, the dielectric cap layer 108 may include a material that may provide high etch resistance, i.e., a dielectric material and also may function as an etch stop material during a subsequent anisotropic etch process that etches the connection-via-level dielectric layer 110. For example, the dielectric cap layer 108 may include silicon carbide or silicon nitride, and may have a thickness in a range from 5 nm to 30 nm, although lesser and greater thicknesses may also be used.

The connection-via-level dielectric layer 110 may include any material that may be used for the dielectric material layers (601, 610, 620, 630). For example, the connection-via-level dielectric layer 110 may include undoped silicate glass or a doped silicate glass deposited by decomposition of tetraethylorthosilicate (TEOS). The thickness of the connection-via-level dielectric layer 110 may be in a range from 50 nm to 200 nm, although lesser and greater thicknesses may also be used. The dielectric cap layer 108 and the connection-via-level dielectric layer 110 may be formed as planar blanket (unpatterned) layers having a respective planar top surface and a respective planar bottom surface that extends throughout the memory array region 100 and the peripheral region 200.

Figure 2:
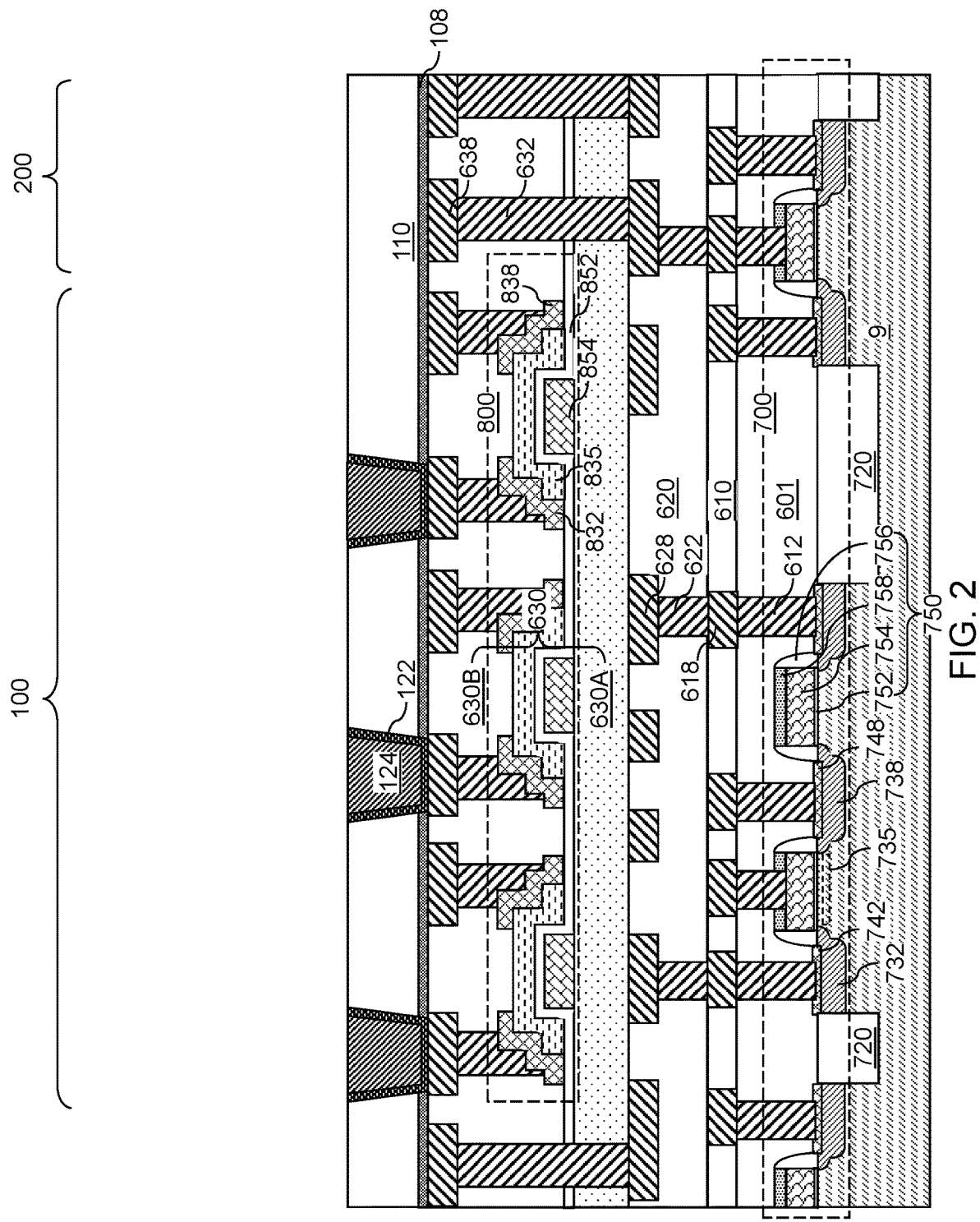
FIG. 2 is a vertical cross-sectional view of the exemplary structure after formation of an array of connection via structures according to an embodiment of the present disclosure.

FIG. 2 is a vertical cross-sectional view of the exemplary structure after formation of an array of connection via structures according to an embodiment of the present disclosure. Referring to FIG. 2, via cavities may be formed through the connection-via-level dielectric layer 110 and the dielectric cap layer 108. For example, a photoresist layer (not shown) may be applied over the connection-via-level dielectric layer 110 and may be patterned to form opening within areas of the memory array region 100 that overlie a respective one of the third metal interconnect structures 638. An anisotropic etch may be performed to transfer the pattern in the photoresist layer through the connection-via-level dielectric layer 110 and the dielectric cap layer 108. The via cavities formed by the anisotropic etch process are herein referred to as lower-electrode-contact via cavities because bottom electrode connection via structures are subsequently formed in the lower-electrode-contact via cavities. The lower-electrode-contact via cavities may have tapered sidewalls having a taper angle (within respective to a vertical direction) in a range from 1 degree to 10 degrees. A top surface of a third metal interconnect structure 638 may be physically exposed at the bottom of each lower-electrode-contact via cavity. The photoresist layer may be subsequently removed, for example, by ashing.

A metallic barrier layer may be formed as a material layer. The metallic barrier layer may cover physically exposed top surfaces of the third metal interconnect structures 638, tapered sidewalls of the lower-electrode-contact via cavities, and the top surface of the connection-via-level dielectric layer 110 without any hole therethrough. The metallic barrier layer may include a conductive metallic nitride such as TiN, TaN, and/or WN. Other suitable materials within the contemplated scope of disclosure may also be used. The thickness of the metallic barrier layer may be in a range from 3 nm to 20 nm, although lesser and greater thicknesses may also be used.

A metallic fill material such as tungsten or copper may be deposited in remaining volumes of the lower-electrode-contact via cavities. Portions of the metallic fill material and the metallic barrier layer that overlie the horizontal plane including the topmost surface of the connection-via-level dielectric layer 110 may be removed by a planarization process such as chemical mechanical planarization. Each remaining portion of the metallic fill material located in a respective via cavity comprises a metallic via fill material portion 124. Each remaining portion of the metallic barrier layer in a respective via cavity comprises a metallic barrier layer 122. Each combination of a metallic barrier layer 122 and a metallic via fill material portion 124 that fills a via cavity constitutes a connection via structure (122, 124). An array of connection via structures (122, 124) may be formed in the connection-via-level dielectric layer 110 on underlying metal interconnect structures.

Figure 3:
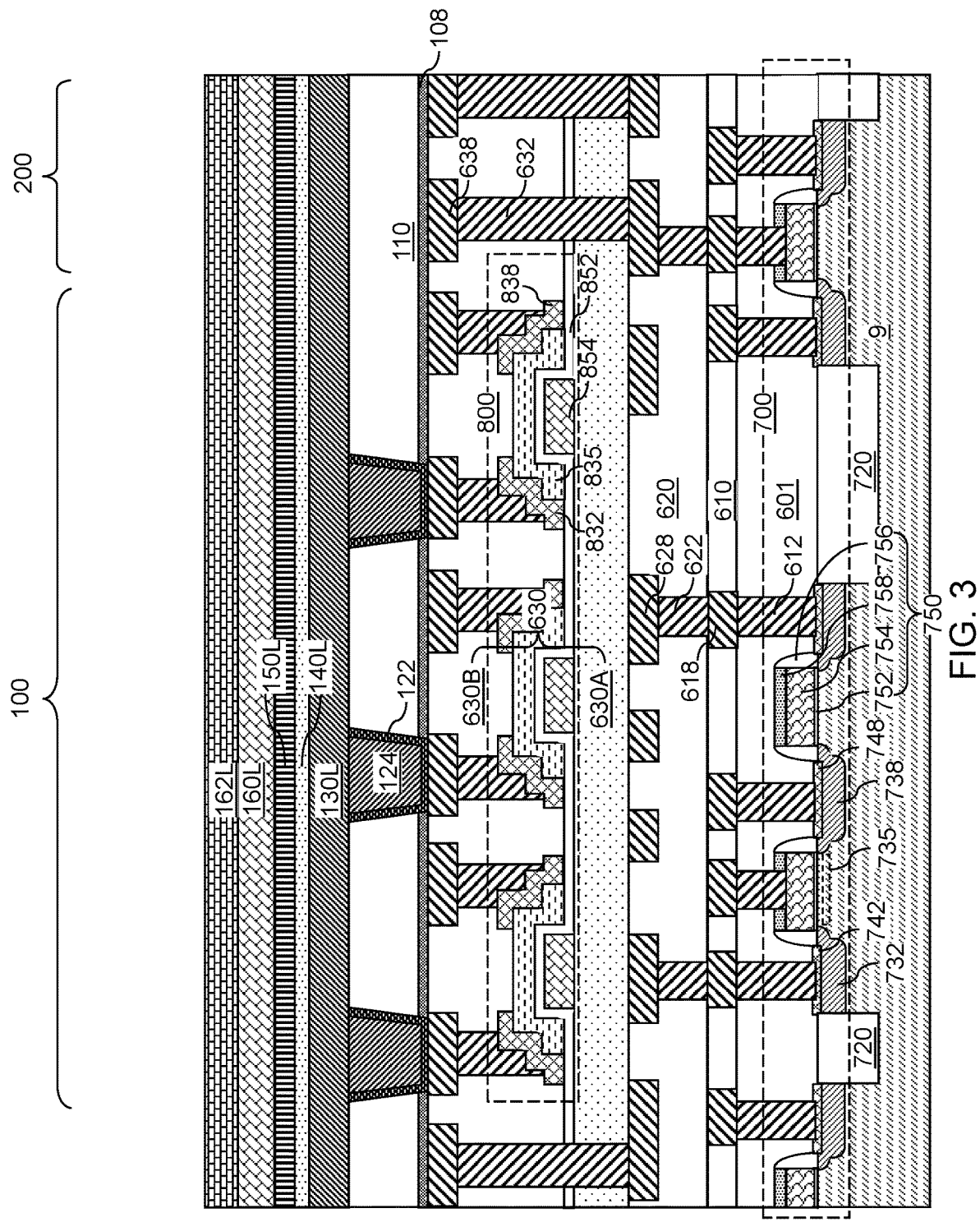
FIG. 3 is a vertical cross-sectional view of the exemplary structure after formation of a bottom electrode material layer, a continuous tunneling dielectric layer, a continuous ferroelectric material layer, a top electrode material layer, and a metallic hard mask material layer according to an embodiment of the present disclosure.

FIG. 3 is a vertical cross-sectional view of the exemplary structure after formation of a bottom electrode material layer, a tunneling dielectric layer, a ferroelectric material layer, a top electrode material layer, and a metallic hard mask material layer according to an embodiment of the present disclosure. In some embodiments, the tunneling dielectric layer may be formed with magnesium oxide as the dielectric material. In some additional embodiments, the tunneling dielectric layer may be a continuous tunneling dielectric layer. In some additional embodiments, the ferroelectric material layer may be formed as a continuous ferroelectric material layer. Referring to the embodiment illustrated in FIG. 3, a layer stack including a bottom electrode material layer 130L, a continuous tunneling dielectric layer 140L, a continuous ferroelectric material layer 150L, a top electrode material layer 160L, and a metallic hard mask material layer 162L may be formed over the connection-via-level dielectric layer 110. The layers within the layer stack may be deposited by a respective chemical vapor deposition process or a respective physical vapor deposition process. Each layer within the layer stack may be deposited as planar blanket material layers having a respective uniform thickness throughout. The continuous tunneling dielectric layer 140L and the continuous ferroelectric material layer 150L are collectively referred to as ferroelectric tunnel junction material layers. In other words, ferroelectric tunnel junction material layers may be formed between the bottom electrode material layer 130L and the top electrode material layer 160L.

While the present disclosure is described using an embodiment in which the ferroelectric tunnel junction material layers include the continuous tunneling dielectric layer 140L and the continuous ferroelectric material layer 150L, the methods and structures of the present disclosure may be applied to any structure in which the ferroelectric tunnel junction material layers include at least one continuous tunneling dielectric layer 140L and at least one continuous ferroelectric material layer 150L. Further, a continuous tunneling dielectric layer 140L may overlie, or underlie, a continuous ferroelectric material layer 150L. Modifications of the present disclosure are expressly contemplated herein in which the ferroelectric tunnel junction material layers include a phase change memory material, a ferroelectric memory material, or a vacancy-modulated conductive oxide material.

The bottom electrode material layer 130L may include, and/or may consist essentially of, at least one of a transition metal, a conductive metallic nitride, and a conductive metallic carbide. In one embodiment, the bottom electrode material layer 130L includes at least one metallic material such as TiN, TaN, WN, W, Cu, Al, Ti, Ta, Ru, Co, Mo, Pt, an alloy thereof, and/or a combination thereof. Other suitable metallic materials within the contemplated scope of disclosure may also be used. For example, the bottom electrode material layer 130L may include, and/or may consist essentially of, an elemental metal such as W, Cu, Ti, Ta, Ru, Co, Mo, or Pt. The thickness of the bottom electrode material layer 130L may be in a range from 10 nm to 100 nm, although lesser and greater thicknesses may also be used.

The continuous tunneling dielectric layer 140L includes, and/or consists essentially of, magnesium oxide, aluminum oxide, or another dielectric metal oxide. According to an embodiment of the present disclosure, portions of the continuous tunneling dielectric layer 140L may be subsequently used as a tunneling dielectric in a ferroelectric tunnel junction. In one embodiment, the continuous tunneling dielectric layer 140L includes magnesium oxide or a magnesium oxide-containing material. The magnesium oxide material in the continuous tunneling dielectric layer 140L has a tendency to grow along a <001> direction, i.e., in a manner that forms crystalline grains having a <001> direction along the vertical direction. The preferential alignment of the growth orientations of the grains of the magnesium oxide material of the continuous tunneling dielectric layer 140L causes large grain growth in the continuous ferroelectric material layer 150L to be subsequently deposited thereupon. A predominant fraction (i.e., more than 40%) of the grains of the continuous tunneling dielectric layer 140L may be aligned along the <001> direction.

The predominant alignment of the grains of the continuous tunneling dielectric layer 140L along the vertical direction may improve the domain uniformity of the magnesium oxide material in the continuous ferroelectric material layer 150L to be subsequently deposited thereupon. The continuous tunneling dielectric layer 140L may be formed by physical vapor deposition, vacuum evaporation, or atomic layer deposition. The thickness of the continuous tunneling dielectric layer 140L may be in a range from 0.7 nm to 4 nm, such as from 1 nm to 3 nm, although lesser and greater thicknesses may also be used.

The continuous ferroelectric material layer 150L includes a ferroelectric material having two stable directions for electrical polarization. The two stable directions may be the upward direction and the downward direction. The ferroelectric material of the continuous ferroelectric material layer 150L may include at least one material selected from Wurzite-based ferroelectric nitride materials, hafnium oxide, hafnium zirconium oxide, barium titanate, colemanite, bismuth titanate, europium barium titanate, ferroelectric polymer, germanium telluride, langbeinite, lead scandium tantalate, lead titanate, lead zirconate titanate, lithium niobate, polyvinylidene fluoride, potassium niobate, potassium sodium tartrate, potassium titanyl phosphate, sodium bismuth titanate, lithium tantalate, lead lanthanum titanate, lead lanthanum zirconate titanate, ammonium dihydrogen phosphate, and potassium dihydrogen phosphate. Other suitable ferroelectric materials are within the contemplated scope of disclosure. The continuous ferroelectric material layer 150L may be deposited, for example, by physical vapor deposition. The thickness of the continuous ferroelectric material layer 150L may be in a range from 2 nm to 20 nm, such as from 4 nm to 10 nm, although lesser and greater thicknesses may also be used.

According to an aspect of the present disclosure, the ferroelectric material of the continuous ferroelectric material layer 150L includes a Wurzite-based ferroelectric nitride material such as an MN or GaN as a base material suitably doped with materials such as ScN or YN, for example. In some embodiments, the nature and amount of dopant of the base material may be selected according to other application or circuit requirements, such as the thickness of the ferroelectric layer. Wurzite-based ferroelectric nitride materials include scandium-doped aluminum nitride, yttrium-doped aluminum nitride, scandium-doped gallium nitride, yttrium-doped gallium nitride, scandium-doped indium nitride, yttrium-doped indium nitride. For example, $Al_{1-x}Sc_xN$ with x in a range from 0.1 to 0.4 can provide a hysteresis curve for electrical polarization having a very square-like polarization-voltage (PV) loop and large remanent polarization and large coercivity. According to an aspect of the present disclosure, a Wurzite-based ferroelectric nitride material may be employed for the continuous ferroelectric material layer 150L to provide a tight distribution of the coercive field, and to provide more reliable switching of the ferroelectric devices.

In one embodiment, the magnesium oxide material in the continuous tunneling dielectric layer 140L may improve the domain uniformity of the continuous ferroelectric material layer 150L. Increase in the domain size and the domain uniformity in the ferroelectric material of the continuous ferroelectric material layer 150L provides more coherent electron tunneling, and large ferroelectric tunneling resistance, i.e., a large ratio between the resistance of the high resistance state of the ferroelectric tunnel junction and the resistance of the low resistance state of the ferroelectric tunnel junction.

The top electrode material layer 160L includes a top electrode material, which may include any metallic material that may be used for the bottom electrode material layer 130L. The top electrode material layer 160L may include, and/or may consist essentially of, at least one of a transition metal, a conductive metallic nitride, and a conductive metallic carbide. Exemplary metallic materials that may be used for the top electrode material layer 160L include, but are not limited to, TiN, TaN, WN, W, Cu, Al, Ti, Ta, Ru, Co, Mo, Pt, an alloy thereof, and/or a combination thereof. Other suitable materials within the contemplated scope of disclosure may also be used. For example, the top electrode material layer 160L may include, and/or may consist essentially of, an elemental metal such as W, Cu, Ti, Ta, Ru, Co, Mo, or Pt. The thickness of the top electrode material layer 160L may be in a range from 10 nm to 100 nm, although lesser and greater thicknesses may also be used.

The metallic hard mask material layer 162L is optional. In embodiments in which the metallic hard mask material layer 162L is present, the metallic hard mask material layer 162L may include a metallic etch stop material that provides high resistance to an anisotropic etch process to be subsequently used to etch a dielectric material (which may include, for example, undoped silicate glass, a doped silicate glass, or organosilicate glass). In one embodiment, the metallic hard mask material layer 162L may include a conductive metallic nitride material (such as TiN, TaN, or WN) or a conductive metallic carbide material (such as TiC, TaC, or WC). Other suitable metallic hard mask materials are within the contemplated scope of disclosure. In one embodiment, the metallic hard mask material layer 162L includes, and/or consists essentially of, TiN. The metallic hard mask material layer 162L may be deposited by chemical vapor deposition or physical vapor deposition. The thickness of the metallic hard mask material layer 162L may be in a range from 2 nm to 20 nm, such as from 3 nm, to 10 nm, although lesser and greater thicknesses may also be used.

Generally, a layer stack including a bottom electrode material layer 130L, ferroelectric tunnel junction material layers (140L, 150L), and a top electrode material layer 160L is formed over a substrate 9. The ferroelectric tunnel junction material layers comprise at least one continuous ferroelectric material layer 150L and at least one continuous tunneling dielectric layer 140L.

Figure 4:
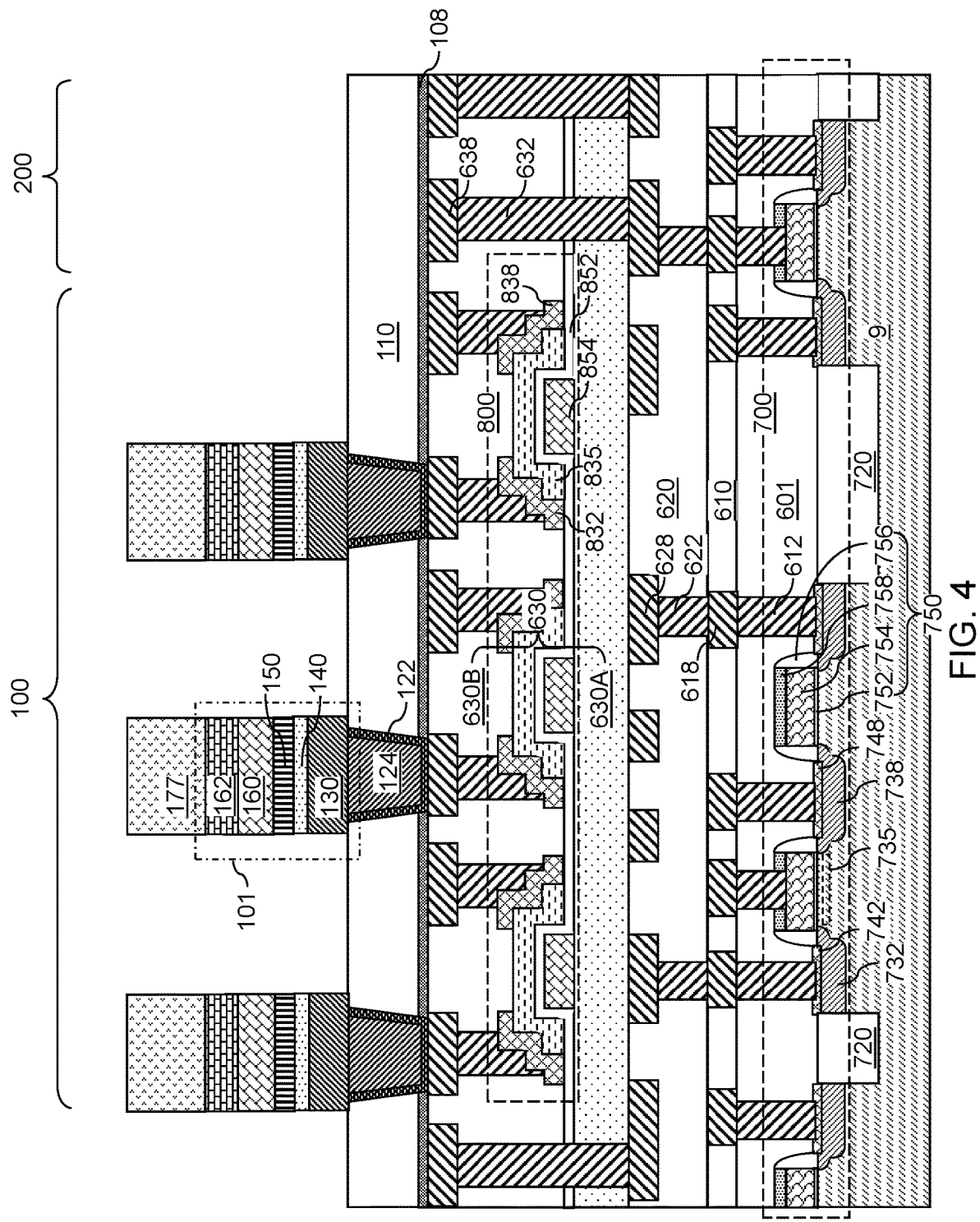
FIG. 4 is a vertical cross-sectional view of the exemplary structure after formation of ferroelectric tunnel junction memory cells according to an embodiment of the present disclosure.

FIG. 4 is a vertical cross-sectional view of the exemplary structure after formation of ferroelectric tunnel junction memory cells according to an embodiment of the present disclosure. Referring to FIG. 4, an etch mask 177 including a two-dimensional array of etch mask portions may be formed over the metallic hard mask material layer 162L and/or the top electrode material layer 160L. For example, the etch mask 177 may include a two-dimensional array of patterned photoresist material portions that are formed by applying and lithographically patterning a photoresist material layer. In one embodiment, the etch mask 177 may include a two-dimensional periodic array (such as a two-dimensional rectangular array) of patterned photoresist material portions. Each patterned photoresist material portion may have a horizontal cross-sectional shape of a circle, a rectangle, a rounded rectangle, an ellipse, or any other closed curvilinear shape. In embodiments in which the etch mask 177 includes a two-dimensional array of etch mask material portions (such as photoresist material portions), the pitch of the etch mask 177 along each horizontal direction of periodicity may be in a range from 20 nm to 400 nm, such as from 40 nm to 200 nm, although lesser and greater pitches may also be used.

An anisotropic etch process may be performed to transfer the pattern in the etch mask 177 through the layer stack (162L, 160L, 150L, 140L, 130L) including the metallic hard mask material layer 162L, the top electrode material layer 160L, the ferroelectric tunnel junction material layers (150L, 140L), and the bottom electrode material layer 130L. The anisotropic etch process etches unmasked portions of the layer stack (162L, 160L, 150L, 140L, 130L), and forms a two-dimensional array of ferroelectric tunnel junction memory cells 101.

Each ferroelectric tunnel junction memory cell 101 includes a vertical stack including a bottom electrode 130, a tunneling dielectric layer 140, a ferroelectric material layer 150, a top electrode 160, and a metallic hard mask portion 162. In one embodiment, the etch mask 177 may be consumed during the anisotropic etch process, and the metallic hard mask portions 162 may be used as an additional etch mask during patterning of the bottom electrode material layer 130L. Each metallic hard mask portion 162 is a patterned portion of the metallic hard mask material layer 162L. Each top electrode 160 is a patterned portion of the top electrode material layer 160L. Each ferroelectric material layer 150 is a patterned portion of the continuous ferroelectric material layer 150L. Each tunneling dielectric layer 140 is a patterned portion of the continuous tunneling dielectric layer 140L. Each bottom electrode 130 is a patterned portion of the bottom electrode material layer 130L.

The sidewalls of the layers within each ferroelectric tunnel junction memory cell 101 may be vertically coincident, i.e., may be located within a vertical plane including sidewalls of at least one overlying layer and/or at least one underlying layer. The sidewalls of the layers within each ferroelectric tunnel junction memory cell 101 may be vertical, or may have a taper angle in a range from 0.1 degree to 30 degrees. The etch mask 177 may be subsequently removed, for example, by ashing. Optionally, dielectric spacers (not shown) may be formed around the array of ferroelectric tunnel junction memory cells 101.

An array of ferroelectric tunnel junction (FTJ) memory cells 101 may be formed. Each FTJ memory cell 101 may include a bottom electrode 130 located over a substrate 9, a top electrode 160 overlying the bottom electrode 130, and a ferroelectric tunnel junction (FTJ) memory element (140, 150) located between the bottom electrode 130 and the top electrode 160 and including a ferroelectric material layer 150 and a tunneling dielectric layer 140.

In one embodiment, a sidewall of the tunneling dielectric layer 140 in an FTJ memory element (140, 150) may be vertically coincident with a sidewall of the ferroelectric material layer 150 in the FTJ memory element (140, 150). The array of connection via structures (122, 124) may be formed within the connection-via-level dielectric layer 110, and may contact bottom surfaces of the bottom electrodes 130 of the FTJ memory cells 101. Each tunneling dielectric layer 140 may include polycrystalline magnesium oxide grains. The polycrystalline magnesium oxide grains may have a predominant crystallographic orientation that is a <001> direction and is perpendicular to the horizontal interface between each contacting pair of a ferroelectric material layer 150 and a tunneling dielectric layer 140.

Figure 5:
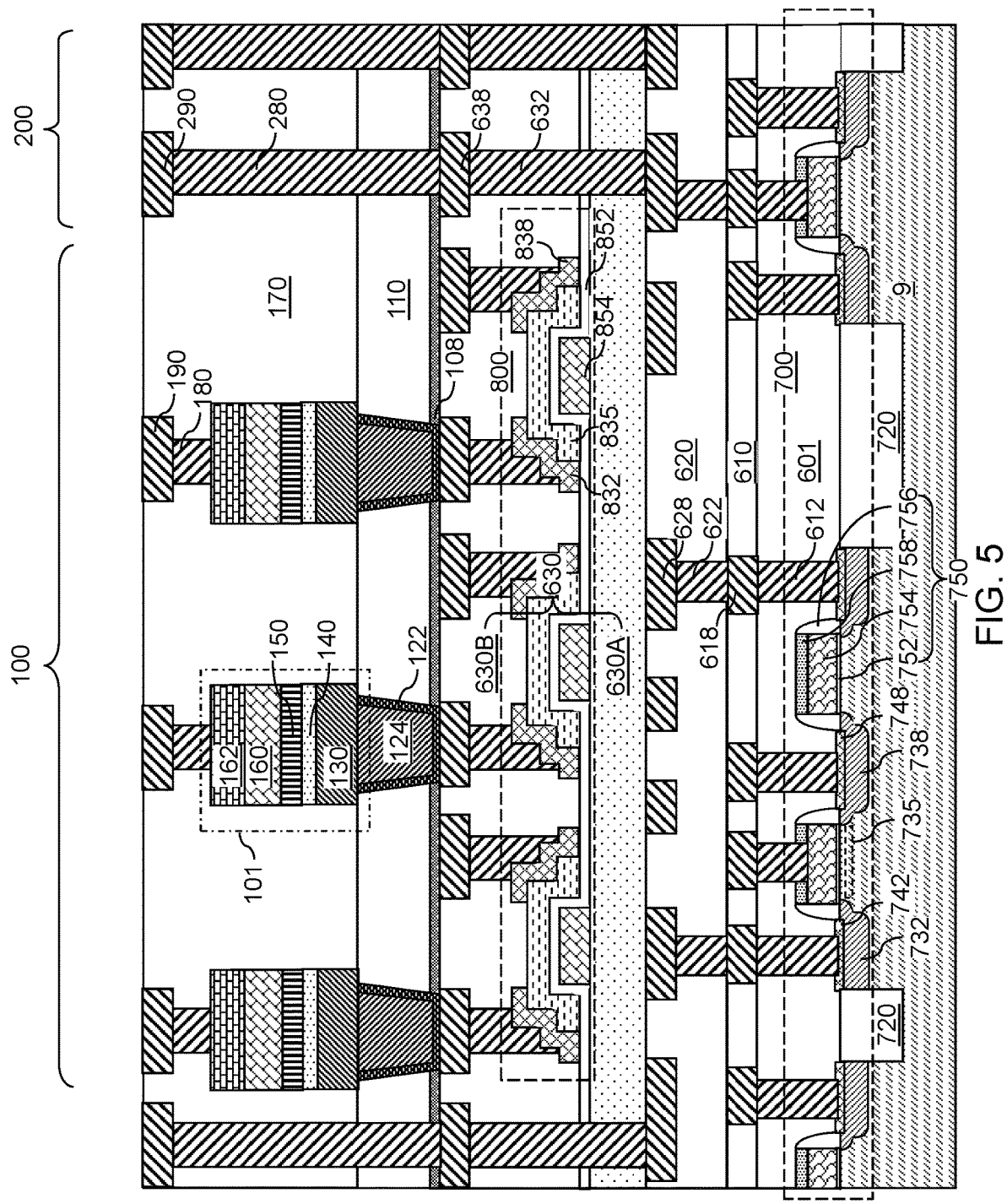
FIG. 5 is a vertical cross-sectional view of the exemplary structure after formation of a memory-level dielectric layer and memory-level metal interconnect structures according to an embodiment of the present disclosure.

FIG. 5 is a vertical cross-sectional view of the exemplary structure after formation of a memory-level dielectric layer and memory-level metal interconnect structures according to an embodiment of the present disclosure. Referring to FIG. 5, a memory-level dielectric layer 170 may be formed around, and over, the array of FTJ memory cells 101 and the connection-via-level dielectric layer 110. The memory-level dielectric layer 170 includes a planarizable dielectric material such as undoped silicate glass or a doped silicate glass. The dielectric material of the memory-level dielectric layer 170 may be deposited by a conformal deposition process (such as a chemical vapor deposition process) or a self-planarizing deposition process (such as spin coating).

At least one lithographic patterning step and at least one anisotropic etch process may be used for form interconnect cavities in the memory-level dielectric layer 170. For example, a first photoresist layer (not shown) may be applied over the memory-level dielectric layer 170 and may be lithographically patterned to form an array of discrete openings in the first photoresist layer in the peripheral region 200. A first anisotropic etch process may be performed to form via cavities in the memory-level dielectric layer 170. After removal of the first photoresist layer, a second photoresist layer (not shown) may be applied over the memory-level dielectric layer 170 and may be lithographically patterned to form line-shaped openings in the second photoresist layer within the peripheral region 200. A second anisotropic etch process may be performed to form line cavities in the memory-level dielectric layer 170. The second photoresist layer may be subsequently removed. In one embodiment, the interconnect cavities may be formed as integrated line and via cavities. In this embodiment, each integrated line and via cavity may include a line cavity and at least one via cavity. A top surface of a metallic hard mask portion 162 (or a top surface of a top electrode 160) may be physically exposed at the bottom of each via cavity that is formed in the memory array region 100, and a top surface of a metal line structure (such as a third metal line structure 638) may be physically exposed at the bottom of each via cavity that is formed in the peripheral region 200.

At least one metallic material may be deposited in the interconnect cavities. The at least one metallic material is herein referred to as at least one memory-level metallic material. In one embodiment, a metallic barrier material layer (such as a TiN, layer, TaN layer, and/or a WN layer) and a metallic fill material (such as W, Cu, Co, Ru, Mo, or an intermetallic alloy) may be deposited in the interconnect cavities and over the memory-level dielectric layer 170.

A planarization process such as a chemical mechanical planarization process may be performed to remove the at least one memory-level metallic material from above the memory-level dielectric layer 170. The chemical mechanical planarization process may remove material portions from above the horizontal plane including the top surface of the memory-level dielectric layer 170. Remaining portions of the at least one memory-level metallic material filling the interconnect cavities comprise memory-level metal interconnect structures (180, 190, 280, 290). The memory-level metal interconnect structures (180, 190, 280, 290) may include first memory-level line and via structures (180, 190) formed in the memory array region 100 and second memory-level line and via structures (280, 290) formed in the peripheral region 200.

Each first memory-level line and via structures (180, 190) may include a respective metal via portion 180 that contacts a top surface of a metallic hard mask portion 162 (or a top surface of a top electrode 160), and a respective metal line portion 190 overlying, and adjoined to, the respective metal via portion 180. Each second memory-level line and via structures (280, 290) may include a respective metal via portion 280 that contacts a top surface of a metal line structure (such as a third metal line structure 638), and a respective metal line portion 290 overlying, and adjoined to, the respective metal via portion 280. Top surfaces of the memory-level metal interconnect structures (180, 190, 280, 290) may be located within the horizontal plane including the top surface of the memory-level dielectric layer 170.

Generally, a dielectric material layer (such as a memory-level dielectric layer 170) may be formed over, and around, the array of FTJ memory cells 101. The dielectric material layer has formed within, and laterally surrounds, the array of FTJ memory cells 101. Metal interconnect structures (such as the first memory-level metal interconnect structures (180, 190)) comprising a metal via portion may be formed through the dielectric material layer. The metal interconnect structure contacts, or is electrically connected to, the top electrodes 160, which are patterned portions of the top electrode material layer 150L. An array of metal interconnect structures including a respective metal via portion may be provided. The metal via portions may be electrically connected to a respective top electrode 150 selected from the array of FTJ memory cells 101.

While the present disclosure is described using an embodiment in which the memory-level metal interconnect structures (180, 190, 280, 290) are formed as integrated line and via structures, embodiments are expressly contemplated herein in which the metal via portions (180, 280) are formed using a first single damascene process and the metal line portions (190, 290) are formed using a second single damascene process. In this embodiment, the memory-level dielectric layer 170 may include a vertical stack of a lower dielectric material layer having formed therein the metal via portions (180, 280) and an upper dielectric material layer having formed therein the metal line portions (190, 290). The memory-level dielectric layer 170 functions as a fourth line-and-via-level dielectric material layer that overlies the third line-and-via-level dielectric material layer 630.

Figure 6:
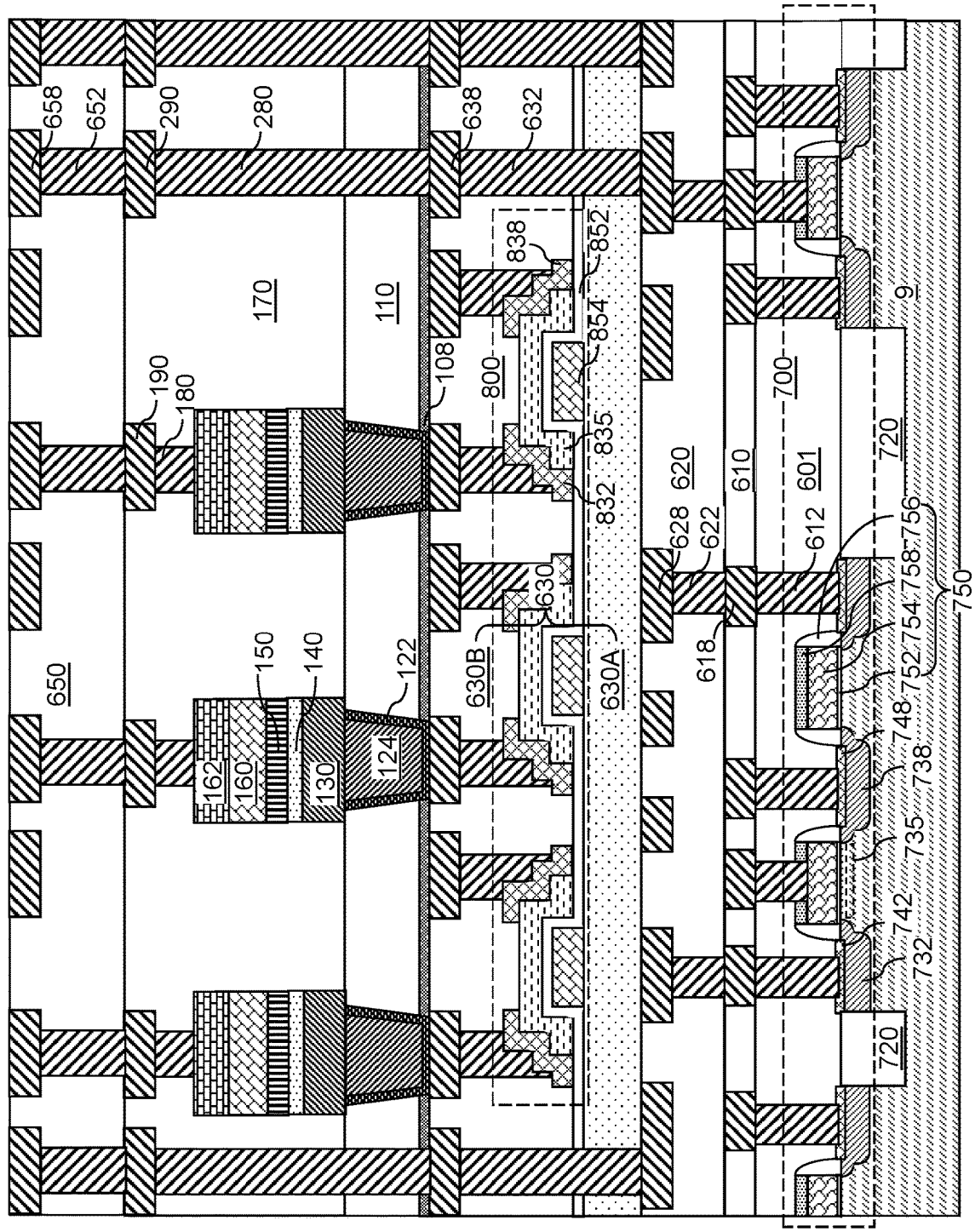
FIG. 6 is a vertical cross-sectional view of the exemplary structure after formation of upper-level metal interconnect structures according to an embodiment of the present disclosure.

FIG. 6 is a vertical cross-sectional view of the exemplary structure after formation of upper-level metal interconnect structures according to an embodiment of the present disclosure. Referring to FIG. 6, a fifth line-and-via-level dielectric material layer 650 may be subsequently formed over the memory-level dielectric layer 170. The fifth line-and-via-level dielectric material layer 650 may include an interlay dielectric (ILD) material that may be used for any of the underlying dielectric material layers (601, 610, 620, 630, 110, 170). At least one lithographic patterning step and at least one anisotropic etch process may be used for form fifth-level interconnect cavities. At least one metallic material may be deposited in the fifth-level interconnect cavities. In one embodiment, a metallic barrier material layer (such as a TiN, layer, TaN layer, and/or a WN layer) and a metallic fill material (such as W, Cu, Co, Ru, Mo, or an intermetallic alloy) may be deposited in the fifth-level interconnect cavities. A planarization process such as a chemical mechanical planarization process may be performed to remove the at least one upper-level metallic material from above the horizontal plane including the top surface of the fifth line-and-via-level dielectric material layer 650. Remaining portions of the at least one metallic material filling the fifth-level interconnect cavities comprise fourth metal via structures 652 and fifth metal line structures 658, which may be formed as integrated line and via structures. Alternatively, the fourth metal via structures 652 and fifth metal line structures 658 may be formed using two single damascene processes. The fourth metal via structures 652 and the fifth metal line structures 658 are herein referred to as upper-level metal interconnect structures. Additional upper-level metal interconnect structures (not shown) may be formed as necessary.

In one embodiment, access transistors (as provided in a CMOS circuitry 700 or comprising thin film transistors 800) may be located between the substrate 9 and the bottom electrodes 130 of the array of FTJ memory cells 101. As the memory cell may be formed in a BEOL position, the access transistors may also be formed in the BEOL. In some applications, transistors may be fabricated in a BEOL position. By fabricating the transistors in the BEOL position, functionality may be added at the BEOL while valuable chip area may be made available in the FEOL. Such transistors may utilize materials other than silicon-based materials to form a semiconducting channel or dope drain and source regions. For example, metal oxide semiconductors may be used that may control the semiconducting properties by adjusting the relative concentrations of materials. Moreover, transistors that use metal oxide semiconductors may be an attractive option for BEOL integration since such transistors may be processed at low temperatures (such as at temperatures below 400 degrees Celsius) and thus, will not damage previously fabricated devices. Source and drain regions of such transistors do not require doped semiconductor material regions containing activated (substitutional) dopants, but may employ a metallic material instead. Such metal oxide semiconductors may include a semiconducting oxide, such as InGaZnO (IGZO), indium tin oxide (ITO), InWO, InZnO, InSnO, GaOx, InOx, or the like. Other suitable metal oxide semiconducting materials are within the contemplated scope of disclosure.

A source region (732 or 832) or a drain region (738 or 838) of each access transistor may be electrically connected to the bottom electrode 130 or to the top electrode 160 of a respective FTJ memory cell 101 by a set of at least one metal interconnect structure. While the present disclosure is described using an embodiment in which the TFTs 800 are formed underneath the array of FTJ memory cells 101, embodiments are expressly contemplated herein in which the TFTs are formed above the array of FTJ memory cells 101. Generally, a ferroelectric tunnel junction (FTJ) memory array may be provided. The FTJ memory array may comprise an array of access transistors (700, 800) located on, or over, a substrate 9, and an array of ferroelectric tunnel junction (FTJ) memory cells 101 overlying, or underlying, or located at a same level as, the array of access transistors. Top electrodes 160 and/or bottom electrodes 130, of the FTJ memory cells 101 may be connected to source regions (732, 832) or drain regions (738, 838) of the access transistors (700, 800).

Figure 7:
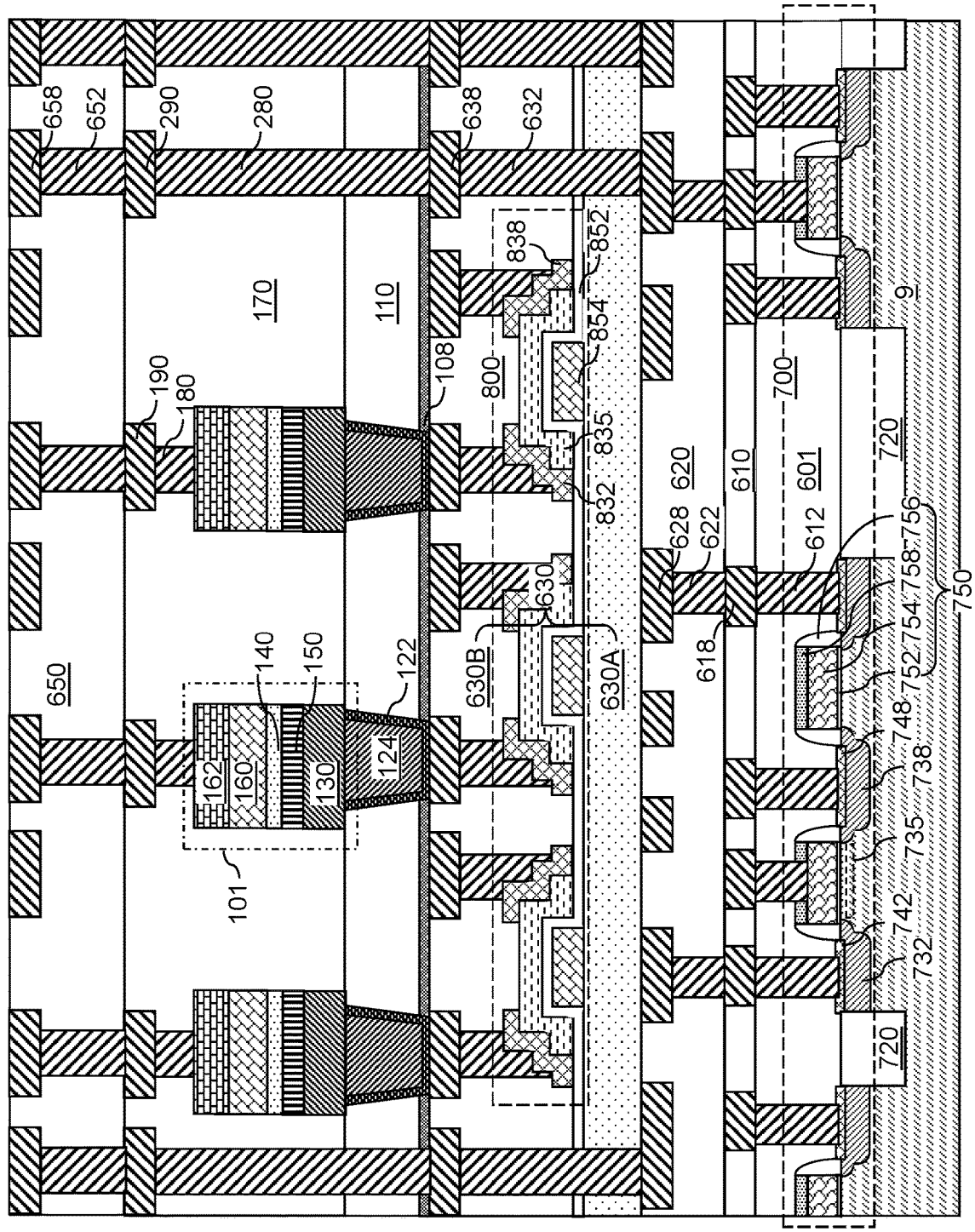
FIG. 7 is a vertical cross-sectional view of a first alternative embodiment of the exemplary structure according to an embodiment of the present disclosure.

FIG. 7 is a vertical cross-sectional view of a first alternative embodiment of the exemplary structure according to an embodiment of the present disclosure. Referring to FIG. 7, a first alternative embodiment of the exemplary structure according to an embodiment of the present disclosure may be derived from the exemplary structure of FIG. 6 by changing the order of the continuous tunneling dielectric layer 140L and the continuous ferroelectric material layer 150L at the processing steps of FIG. 3. Thus, the ferroelectric material layer 150 contacts a top surface of the bottom electrode 130 within each FTJ memory cell 101, and the tunneling dielectric layer 140 contacts a top surface of the ferroelectric material layer 150 and a bottom surface of the top electrode 160 within each FTJ memory cell 101. The tunneling dielectric layer 140 comprises polycrystalline magnesium oxide grains, and a predominant fraction (i.e., more than 40%) of the grains of the tunneling dielectric layer 140 may be aligned along the <001> direction.

Figure 8:
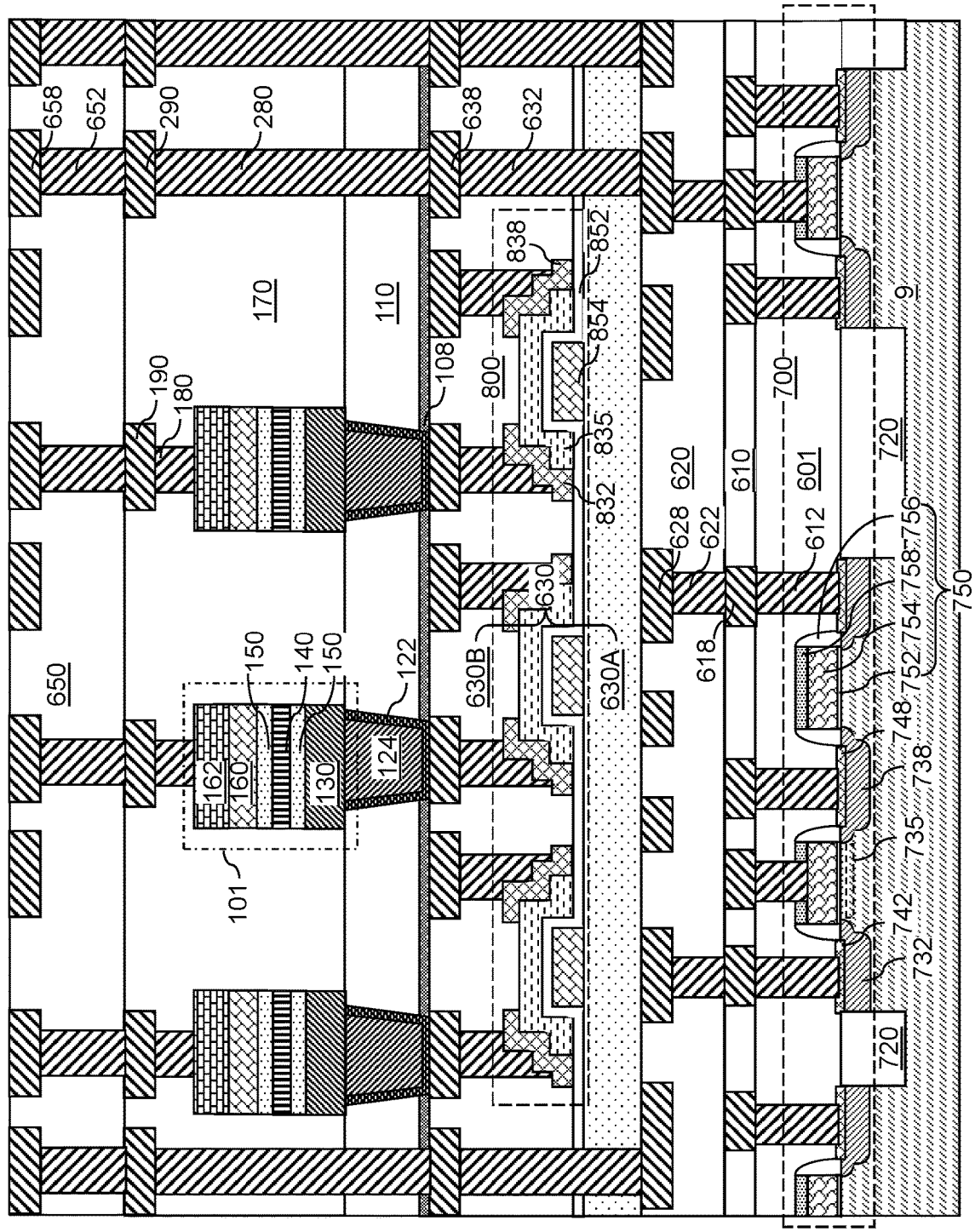
FIG. 8 is a vertical cross-sectional view of a second alternative embodiment of the exemplary structure according to an embodiment of the present disclosure.

FIG. 8 is a vertical cross-sectional view of a second alternative embodiment of the exemplary structure according to an embodiment of the present disclosure. Referring to FIG. 8, a second alternative embodiment of the exemplary structure may be derived from the exemplary structure of FIG. 6 by using a plurality of tunneling dielectric layers 140 in lieu of a single tunneling dielectric layer 140 within each FTJ memory cell 101. Use of a plurality of tunneling dielectric layers 140 can provide the benefit of enhancing uniformity of grains within each ferroelectric material layer 150. In this embodiment, a stack of a continuous tunneling dielectric layer 140L, a continuous ferroelectric material layer 150L, and another continuous tunneling dielectric layer 140L may be deposited at the processing steps of FIG. 3 in lieu of the stack of a continuous tunneling dielectric layer 140L and a continuous ferroelectric material layer 150L. Thus, each ferroelectric tunnel junction memory element (140, 150) within a ferroelectric tunnel junction memory cell 101 includes a vertical stack including, from bottom to top, a first tunneling dielectric layer 140, a ferroelectric material layer 150, and a second tunneling dielectric layer 140. Thus, first tunneling dielectric layer may contact a top surface of the bottom electrode 130 within each FTJ memory cell 101, and the second tunneling dielectric layer 140 may contact a bottom surface of the top electrode 160 within each FTJ memory cell 101. The ferroelectric material layer 150 may contact the first tunneling dielectric layer 140 and the second tunneling dielectric layer 140. Each tunneling dielectric layer 140 may have a thickness in a range from 0.7 nm to 3 nm, such as from 1 nm to 2 nm, although lesser and greater thicknesses may also be used. The tunneling dielectric layer 140 comprises polycrystalline magnesium oxide grains, and a predominant fraction (i.e., more than %) of the grains of the tunneling dielectric layer 140 may be aligned along the <001> direction. The thickness of the ferroelectric material layer 150 in each FTJ memory element (140, 150) may be in a range from 2 nm to 20 nm, such as from 4 nm to 10 nm, although lesser and greater thicknesses may also be used.

Figure 9:
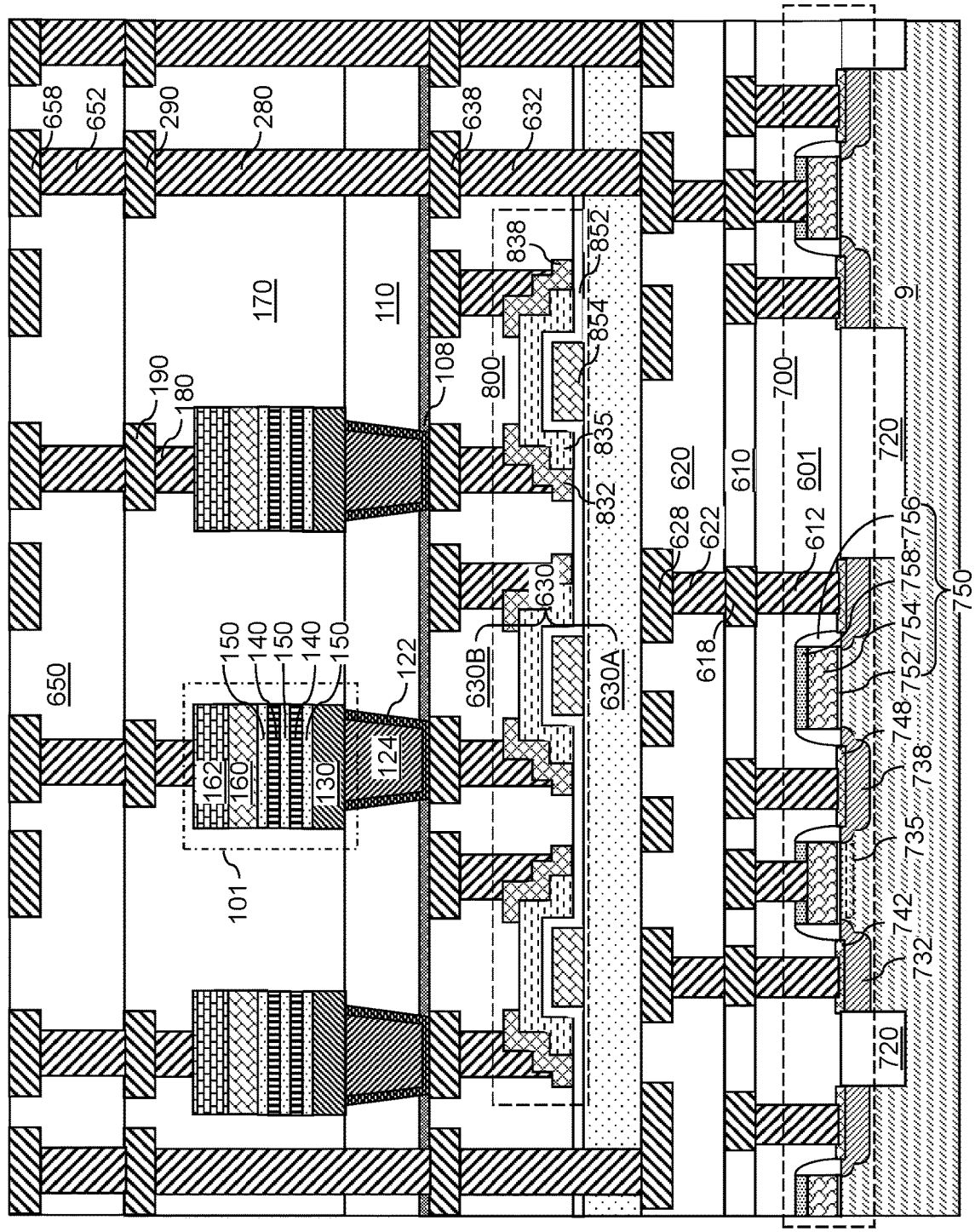
FIG. 9 is a vertical cross-sectional view of a third alternative embodiment of the exemplary structure according to an embodiment of the present disclosure.

FIG. 9 is a vertical cross-sectional view of a third alternative embodiment of the exemplary structure according to an embodiment of the present disclosure. Referring to FIG. 9, a third alternative embodiment of the exemplary structure may be derived from the exemplary structure of FIG. 6 by using at least two repetitions of a layer stack including a tunneling dielectric layer 140 and a ferroelectric material layer 150 in lieu of a layer stack including a single tunneling dielectric layer 140 and a single ferroelectric material layer 150 within each FTJ memory cell 101. In this embodiment, at least two repetitions of a layer stack including a continuous tunneling dielectric layer 140L and a continuous ferroelectric material layer 150L may be deposited at the processing steps of FIG. 3 in lieu of the stack of a continuous tunneling dielectric layer 140L and a continuous ferroelectric material layer 150L. Thus, each ferroelectric tunnel junction memory element (140, 150) within a ferroelectric tunnel junction memory cell 101 includes at least two repetitions of a layer stack including a tunneling dielectric layer 140 and a ferroelectric material layer 150. In other words, each FTJ memory element (140, 150) within a ferroelectric tunnel junction memory cell 101 includes at least two tunneling dielectric layers 140 and at least two ferroelectric material layers 150. The total number of the tunneling dielectric layers 140 in each FTJ memory element (140, 150) may be the same as, or may be greater by 1 than, the total number of the ferroelectric material layers 150 within the FTJ memory element (140, 150). Each tunneling dielectric layer 140 may have a thickness in a range from 0.7 nm to 3 nm, such as from 1 nm to 2 nm, although lesser and greater thicknesses may also be used. The tunneling dielectric layer 140 comprises polycrystalline magnesium oxide grains, and a predominant fraction (i.e., more than 40%) of the grains of the tunneling dielectric layer 140 may be aligned along the <001> direction. The thickness of each ferroelectric material layer 150 may be in a range from 2 nm to 20 nm, such as from 4 nm to 10 nm, although lesser and greater thicknesses may also be used.

Figure 10:
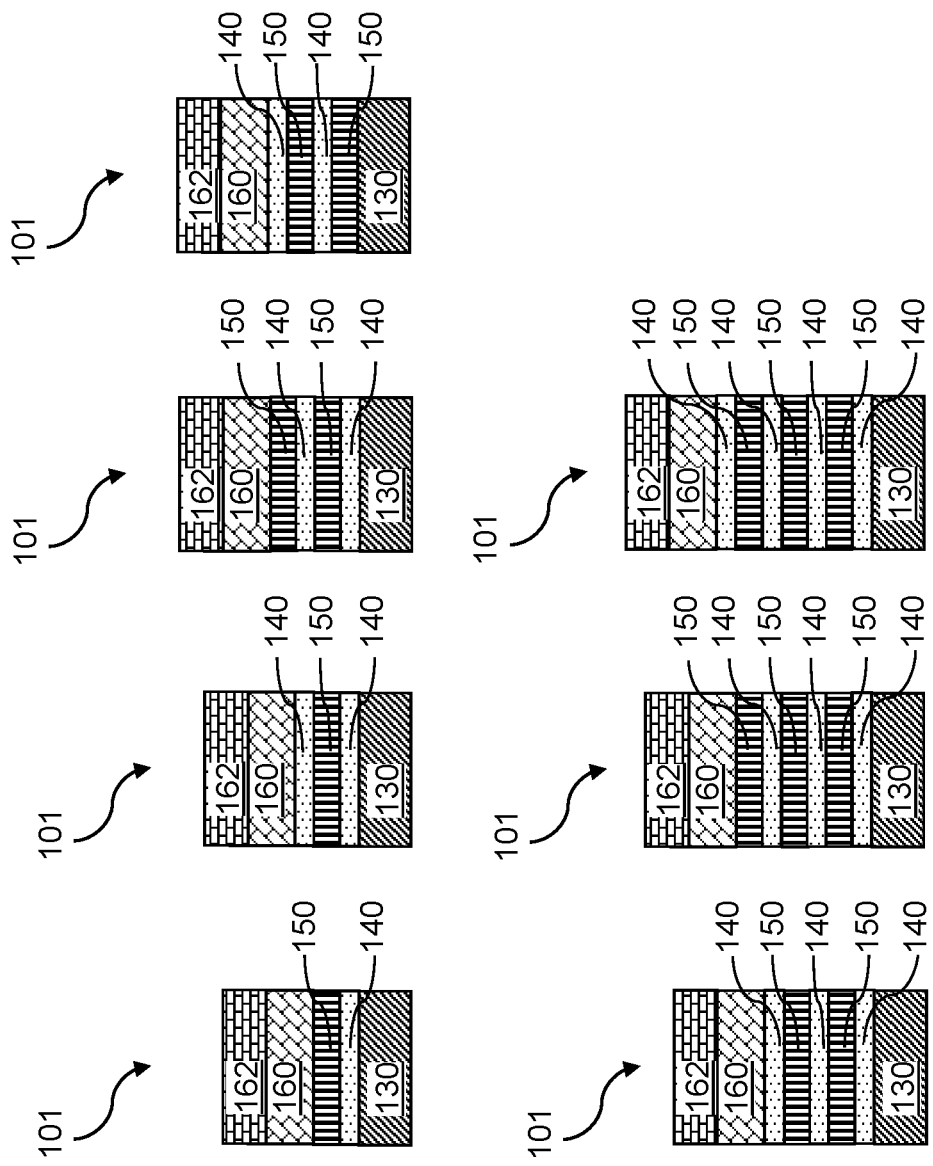
FIG. 10 illustrate vertical cross-sectional views of alternative embodiments of the ferroelectric tunnel junction memory cells according to an embodiment of the present disclosure.

Referring to FIG. 10, alternative configurations for a ferroelectric tunnel junction memory cell 101 within the exemplary structures of the present disclosure are illustrated. Generally, each ferroelectric tunnel junction memory cell 101 can include, from bottom to top, a bottom electrode 130, a ferroelectric tunnel junction memory element (140, 150) including at least one ferroelectric material layer 150 and at least one tunneling dielectric layer 140, and a top electrode 160. The ferroelectric material layer 150 may overlie, and/or underlie, a tunneling dielectric layer 140. A tunneling dielectric layer 140 may overlie, and/or underlie, a ferroelectric material layer 150. Generally, a single ferroelectric material layer 150 or a plurality of ferroelectric material layers 150 may be employed. In case a plurality of ferroelectric material layers 150 is employed, each vertically neighboring pair of ferroelectric material layers 150 can be vertically spaced from each other by a respective tunneling dielectric layer 140. A tunneling dielectric layer 140 or a plurality of tunneling dielectric layers 140 may be employed. In case a plurality of tunneling dielectric layers 140 is employed, each vertically neighboring pair of tunneling dielectric layers 140 can be vertically spaced from each other by a respective ferroelectric material layer 150. In case a plurality of tunneling dielectric layers 140 is employed, the thickness of one or more tunneling dielectric layers 140 may be reduced to increase the electrical current that passes through the ferroelectric tunnel junction memory cell 101.

Figure 11:
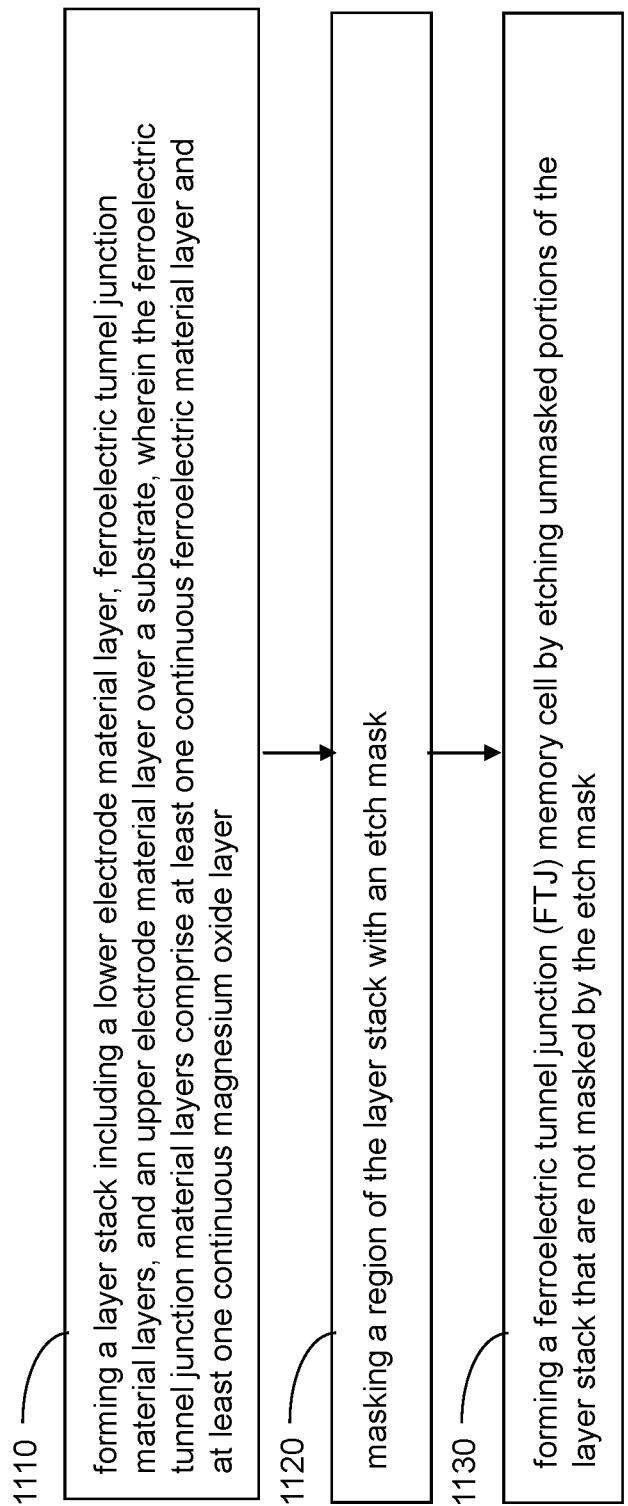
FIG. 11 is a flowchart that illustrates the general processing steps of the methods of the present disclosure.

Referring to FIG. 11, a flowchart illustrates the general processing steps of the methods of the present disclosure, which may be used to manufacture a ferroelectric tunnel junction (FTJ) memory device. Referring to step 1110 and FIGS. 1-3 and 7-10, a layer stack (130L, 140L, 150L, 160L, 162L) including a bottom electrode material layer 130L, ferroelectric tunnel junction material layers (140L, 150L), and a top electrode material layer 160L may be deposited over a substrate 9. The ferroelectric tunnel junction material layers (140L, 150L) comprise at least one continuous ferroelectric material layer 150L and at least one continuous tunneling dielectric layer 140L. Referring to step 1120 and FIGS. 4 and 7-9, a region of the layer stack (130L, 140L, 150L, 160L, 162L) may be masked with an etch mask 177. Referring to step 1130 and FIGS. 4-9, a ferroelectric tunnel junction (FTJ) memory cell 101 may be formed by etching unmasked portions of the layer stack (130L, 140L, 150L, 160L, 162L) that are not masked by the etch mask 177.

Referring to all drawings and according to various embodiments of the present disclosure, a ferroelectric tunnel junction (FTJ) memory device is provided, which comprises: a bottom electrode 130 located over a substrate 9; a top electrode 160 overlying the bottom electrode 130; and a ferroelectric tunnel junction memory element (140, 150) located between the bottom electrode 130 and the top electrode 160 and including at least one ferroelectric material layer 150 and at least one tunneling dielectric layer 140.

According to another embodiment of the present disclosure, a ferroelectric tunnel junction (FTJ) memory array is provided, which comprises: an array of access transistors (700, 800) located on, or over, a substrate 9; and an array of ferroelectric tunnel junction (FTJ) memory cells 101 overlying, or underlying, or located at a same level as, the array of access transistors (700, 800), wherein each FTJ memory cell 101 within the array of FTJ memory cells 101 comprises: a bottom electrode 130; a top electrode 160 overlying the bottom electrode 130; and a ferroelectric tunnel junction (FTJ) memory cell (140, 150) located between the bottom electrode 130 and the top electrode 160 and including at least one ferroelectric material layer 150 and at least one tunneling dielectric layer 140, wherein each FTJ memory cell 101 within the array of FTJ memory cells 101 is electrically connected to a respective access transistor (700, 800) within the array of access transistors (700, 800).

The various embodiments of the present disclosure may be used to provide a non-volatile memory device including at least one ferroelectric material layer 150. Each ferroelectric tunnel junction memory cell 101 may be scaled to consume a switching power on the order of a few fJ. The crystalline magnesium oxide material of the tunneling dielectric layer(s) 140 within each ferroelectric tunnel junction memory cell 101 in the memory device of the present disclosure provides superior tunneling characteristics and a higher tunneling resistance ratio relative to amorphous dielectric oxide materials. For example, aluminum oxide is deposited in an amorphous form, and the thermal constraint on back-end-of-line (BEOL) structures prevents a thermal anneal above 400 degrees Celsius, which is necessary for transformation of an amorphous aluminum oxide material into crystalline aluminum oxide material. The crystalline nature of the magnesium oxide material in the tunneling dielectric layer(s) 140 of the present disclosure provide coherent electron tunneling and a large tunneling electroresistance (TER) due to large and uniform domain uniformity. Thus, use of the tunneling dielectric layer(s) 140 may enhance performance of FTJ memory cells 101 of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a ferroelectric tunnel junction (FTJ) memory device, the method comprising:
   forming a layer stack including a bottom electrode material layer, ferroelectric tunnel junction material layers, and a top electrode material layer over a substrate, wherein the ferroelectric tunnel junction material layers comprise at least one ferroelectric material layer and at least one tunneling dielectric layer;
   masking a region of the layer stack with an etch mask; and
   forming a ferroelectric tunnel junction (FTJ) memory cell by etching unmasked portions of the layer stack that are not masked by the etch mask.

2. The method of claim 1, wherein each of the at least one tunneling dielectric layer comprises polycrystalline magnesium oxide grains.

3. The method of claim 1, wherein:
   the etch mask comprises a patterned photoresist material portion; and
   the unmasked portions of the layer stack are etched by performing an anisotropic etch process.

4. The method of claim 1, further comprising forming a connection via structure formed within a connection-via-level dielectric layer over the substrate, wherein the layer stack is formed over the connection via structure.

5. The method of claim 4, further comprising:
forming a dielectric material layer over, and around, the FTJ memory cell; and
forming a metal interconnect structure including a metal via portion through the dielectric material layer, wherein the metal interconnect structure contacts, or is electrically connected to, the top electrode that is a patterned portion of the top electrode material layer.

6. The method of claim 1, further comprising:
forming a first transistor over the substrate; and
forming a set of at least one metal interconnect structure formed within at least one dielectric material layer, wherein a bottom electrode formed by patterning the bottom electrode material layer is connected to the first transistor through the set of at least one metal interconnect structure.

7. The method of claim 1, wherein the at least one tunneling dielectric layer comprises a plurality of tunneling dielectric layers.

8. The method of claim 1, wherein the at least one ferroelectric material layer comprises a plurality of ferroelectric material layers.

9. The method of claim 8, wherein:
each of the plurality of ferroelectric material layers comprises a ferroelectric material;
each of the at least one tunneling dielectric layer comprises a dielectric metal oxide that is different from the ferroelectric material; and
the plurality of ferroelectric material layers are vertically spaced apart from one another by the at least one tunneling dielectric layer.

10. The method of claim 1, wherein the ferroelectric tunnel junction material layers comprise at least two repetitions of a layer stack including a tunneling dielectric layer and a ferroelectric material layer that are vertically stacked along a vertical direction such that each repetition among the at least two repetitions entirely overlies or entirely underlies any other repetition among the at least two repetitions.

11. A method of manufacturing a ferroelectric tunnel junction (FTJ) memory device, the method comprising:
forming a layer stack including a bottom electrode material layer, ferroelectric tunnel junction material layers, and a top electrode material layer over a substrate, wherein the ferroelectric tunnel junction material layers comprise at least one ferroelectric material layer and at least one tunneling dielectric layer; and
patterning the layer stack into a two-dimensional array of ferroelectric tunnel junction memory cells, wherein each of the ferroelectric tunnel junction memory cells comprises a bottom electrode that is patterned portion of the bottom electrode material layer, a ferroelectric tunnel junction memory element that is a patterned portion of the ferroelectric tunnel junction material layers, and a top electrode that is a patterned portion of the top electrode material layer.

12. The method of claim 11, wherein the at least one tunneling dielectric layer comprises a plurality of tunneling dielectric layers.

13. The method of claim 11, wherein the at least one ferroelectric material layer comprises a plurality of ferroelectric material layers.

14. The method of claim 11, wherein the ferroelectric tunnel junction material layers comprise at least two repetitions of a layer stack including a tunneling dielectric layer and a ferroelectric material layer that are vertically stacked along a vertical direction such that each repetition among the at least two repetitions entirely overlies or entirely underlies any other repetition among the at least two repetitions.

15. The method of claim 11, further comprising forming field effect transistors comprising a respective semiconductor channel including a single crystalline semiconductor material of the substrate on the substrate, wherein the layer stack is formed above the field effect transistors.

16. The method of claim 11, further comprising:
forming first dielectric material layers over the substrate; and
forming thin film transistors embedded in second dielectric material layers over the first dielectric material layers, wherein the layer stack is formed above the thin film transistors.

17. A method of forming a ferroelectric tunnel junction (FTJ) memory array, the method comprising:
forming an array of transistors located on, or over, a substrate; and
forming a layer stack including a bottom electrode material layer, ferroelectric tunnel junction material layers, and a top electrode material layer over a substrate prior to, or after, formation of the array of transistors, wherein the ferroelectric tunnel junction material layers comprise at least one ferroelectric material layer and at least one tunneling dielectric layer; and
patterning the layer stack into a two-dimensional array of ferroelectric tunnel junction memory cells; and
providing electrical connections between the array of transistors and the two-dimensional array of ferroelectric tunnel junction memory cells such that each of the transistors comprises an access transistor for a respective one ferroelectric tunnel junction memory cell within the two-dimensional array of ferroelectric tunnel junction memory cells.

18. The method of claim 17, wherein the at least one ferroelectric material layer comprises a plurality of ferroelectric material layers.

19. The method of claim 18, wherein each of the plurality of ferroelectric material layers is laterally spaced apart from each other or among one another by the at least one tunneling dielectric layer.

20. The method of claim 17, wherein the ferroelectric tunnel junction material layers comprise at least two repetitions of a layer stack including a tunneling dielectric layer and a ferroelectric material layer that are vertically stacked along a vertical direction such that each repetition among the at least two repetitions entirely overlies or entirely underlies any other repetition among the at least two repetitions.

* * * * *